(12) United States Patent
Chen et al.

(10) Patent No.: US 8,018,017 B2
(45) Date of Patent: Sep. 13, 2011

(54) THERMO-MECHANICAL CLEAVABLE STRUCTURE

(75) Inventors: Fen Chen, Williston, VT (US); Cathryn J. Christiansen, Huntington, VT (US); Richard S. Kontra, Williston, VT (US); Tom C. Lee, Essex Junction, VT (US); Alvin W. Strong, Essex Junction, VT (US); Timothy D. Sullivan, Underhill, VT (US); Joseph E. Therrien, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 523 days.

(21) Appl. No.: 10/905,905

(22) Filed: Jan. 26, 2005

(65) Prior Publication Data

US 2006/0163685 A1 Jul. 27, 2006

(51) Int. Cl.
*H01L 31/058* (2006.01)
(52) U.S. Cl. .......... 257/467; 257/259; 257/E23.08; 257/E23.149; 438/54; 438/601
(58) Field of Classification Search .......... 257/467, 257/529, E23.08, E23.149; 438/54, 601
See application file for complete search history.

(56) References Cited

U.S. PATENT DOCUMENTS

| | | | | |
|---|---|---|---|---|
| 6,495,426 | B1 * | 12/2002 | Cheng et al. | 438/393 |
| 6,566,171 | B1 * | 5/2003 | Liu et al. | 438/132 |
| 6,924,207 | B2 * | 8/2005 | Son et al. | 438/396 |
| 7,517,763 | B2 * | 4/2009 | Park et al. | 438/281 |

* cited by examiner

*Primary Examiner* — David S Blum
*Assistant Examiner* — Colleen E Snow
(74) *Attorney, Agent, or Firm* — Anthony J. Canale; Roberts Mlotkowski Safran & Cole, P.C.

(57) ABSTRACT

A thermo-mechanical cleavable structure is provided and may be used as a programmable fuse for integrated circuits. As applied to a programmable fuse, the thermo-mechanical cleavable structure includes an electrically conductive cleavable layer adjacent to a thermo-mechanical stressor. As electricity is passed through the cleavable layer, the cleavable layer and the thermo-mechanical stressor are heated and gas evolves from the thermo-mechanical stressor. The gas locally insulates the thermo-mechanical stressor, causing local melting adjacent to the bubbles in the thermo-mechanical stressor and the cleavable structure forming cleaving sites. The melting also interrupts the current flow through the cleavable structure so the cleavable structure cools and contracts. The thermo-mechanical stressor also contracts due to a phase change caused by the evolution of gas therefrom. As the thermo-mechanical cleavable structure cools, the cleaving sites expand causing gaps to be permanently formed therein.

17 Claims, 8 Drawing Sheets

THERMO-MECHANICAL CLEAVABLE STRUCTURE

FIELD OF THE INVENTION

The invention relates to cleavable structures, and more particularly to thermo-mechanical cleavable structures in integrated circuits.

BACKGROUND DESCRIPTION

Advanced semi-conductor circuitry may use various programmable interconnect elements to connect logic blocks for a number of applications, such as electrically programmable feature selection, speed sorting, die identification, and redundancy implementation. For high-speed applications, the on-state of such structures must have a low resistance. To achieve a high density of such structures in an integrated circuit, the programmable elements should be small.

Programmable fuses are an example of a programmable element. Programmable fuses fall into at least three categories depending on the method of programming. The first category includes laser-blown fuses where the programmable fuses are programmed using a laser to burn or sever the conductive portion of the fuse. The second category includes electrically blown fuses where the fuse is programmed by passing current through it sufficient to overload and open or burn out the fuse. The third category includes electrically blown anti-fuses, where the fuse is programmed with an electric current, which reduces the resistance across the fuse.

In all of these methods of fuse programming, the area surrounding the fuse may be damaged during the programming process due to the heat involved in the programming step, and thus the fuses must have sufficient space between one another on a wafer so that the programming of one fuse does not damage adjacent fuses. For example, laser fusing produces damage to the area surrounding the fused element, which is traded off for fuse blow yield. Another problem with laser fusing is that it requires a large on-chip area to handle laser power capability as well as "line-of-sight" for laser access (which is a component of the area penalty of the laser fusing process). Excessive laser energy can cause silicon substrate damage or massive crater formation that impacts neighboring links. To further aggravate the problem, the laser fuse programming requires that all customization and repair data be collected, and stored off-line after each test. Once all data has been collected, it must be compiled into a single repair solution and translated into XY coordinates corresponding to the fuse locations on the chip. Such problems with laser fusing are not necessarily mitigated by traditional electrically blown fuses because electrically blown fuses typically require a larger voltage than is conveniently available on the chip and their performance and reliability are still to be established.

The typical electrically blown fuse consists of a poly/silicide stack (e.g., $CoSi_2$) at the gate level using a high-current induced electromigration mechanism to program the fuse. However, the typical electrically blown fuse has a relatively complicated structure which may include the polysilicon fuse, a fuse latch, a program latch, a program FET, and a look-ahead programming multiplexer. This complexity adds to the cost of such fuses. Furthermore, for the case of the electrically blown fuse, the post fuse resistance value may have a large variance due to various electromigration induced void sizes, thus making it difficult to precisely control the resistance of the blown fuse. Additionally, the deletion rate of a typical electrically blown fuse is less than 100%, meaning that in many instances after the fusing process, the fuse is not blown and thus not programmed, potentially leading to an inoperative circuit. Also noteworthy in the typical electrically blown fuse is that a blown fuse may heal itself or re-growth during subsequent operation of the surrounding circuitry. Also, such typical fuses are less than stable both in the programmed and unprogrammed state due to void healing under high temperature storage without electrical current.

Additionally, the on-state resistance of a typical electrically blown fuse can not be tightly or precisely controlled. Furthermore, the typical electrically blown fuse is best implemented in the front end of line of manufacturing rather than the back end of line of manufacturing, thus increasing manufacturing costs and reducing design flexibility due to being restricted to a poly-silicon layer. Also, typical electrically blown fuses suffer from a sensitivity change of sensing circuitry over time with device degradation.

BEOL electrically blown fuses using self Joule heating to achieve melting open have been reported. For example, Table 1 shows measured on-state resistance in Ohms ($\Omega$), calculated melting current in milliamps (mA) and melting voltage (V) based on TaN melting temperature (3100° C.), for various traditional BEOL electrically blown TaN fuses of various noted dimensions. The on-state or pre-deletion resistance is the amount of resistance provided by the fuse before programming or deletion. The melting current is the amount of current required to program or delete the fuse, and melting voltage is the voltage required to program or delete the fuse. For example, the first row of Table 1 indicates that for a fuse ten microns wide and ten microns long, the on-state resistance is 56.59$\Omega$, the calculated melting current is 126.28 mA, and the calculated melting voltage is 7.15 V based on TaN melting temperature equal to about 3100° C.

TABLE 1

| Width (um) | Length (um) | On-state Resistance | Required Melting Current | Required Melting Voltage |
|---|---|---|---|---|
| 10 | 10 | 56.59 | 126.28 | 7.15 |
| 10 | 20 | 114 | 126.28 | 14.40 |
| 20 | 10 | 28.12 | 208.30 | 5.86 |
| 20 | 20 | 57.01 | 208.30 | 11.88 |
| 15 | 30 | 114.5 | 167.89 | 19.22 |
| 15 | 45 | 172.3 | 167.89 | 28.93 |
| 10 | 50 | 287.1 | 126.28 | 36.26 |
| 15 | 75 | 287.6 | 167.89 | 48.28 |

As can be seen from Table 1, due to the extremely high melting temperature of TaN material, traditional BEOL TaN electrically blown fuses require a high melting current and high melting voltage with a concurrent potential to damage surrounding components during programming or deletion.

SUMMARY OF THE INVENTION

In a first aspect of the invention, a method of programming a programmable fuse includes raising a temperature of a first portion of a layer to provide decoupling with an overlying and/or underlying layer, and cooling the layer in order to provide contraction of the layer to form a discontinuity in the layer.

In another aspect of the invention, a method of forming a thermo-mechanical cleavable structure includes forming a first thermo-mechanical layer. The method also includes forming a thermal element adjacent to the first thermo-mechanical layer configured to generate heat thereby causing a delamination of the first thermo-mechanical layer from an adjacent layer.

In another aspect of the invention, a method of programming a fuse includes the steps of providing a thermo-mechanical stressor adjacent to a conducting layer, and heating the thermo-mechanical stressor to a predetermined temperature. The method also includes decoupling the thermo-mechanical stressor and the conducting layer from an underlying layer, and/or an overlying layer.

In another aspect of the invention, a thermo-mechanical cleavable structure includes a first thermo-mechanical stressor, and a thermal element adjacent to the thermo-mechanical stressor to generate heat thereby causing a delamination of the first thermo-mechanical stressor from an overlying and/or underlying layer, and cooling both layers so that the combined contraction of both leads to a continuous crack (cleavage) across the thermal element (i.e., conducting layer).

DETAILED DESCRIPTION OF EMBODIMENTS OF THE INVENTION

In general, embodiments of the invention provide low current, repeatable and stable programmable fuses by including a fuse material laminated to a thermo-mechanical stressing material. By heating the fuse material with an electric current, the thermo-mechanical stressing material emits a gas to thermally insulate the thermo-mechanical stressing material from surrounding heat conductors thereby causing local hot spots. The local hot spots subsequently melt in the thermo-mechanical stressor and the fuse material adjacent thereto thus severing the fuse. Additionally, the thermo-mechanical stressor first expands when heated and contracts due to emitting gas contained therein, and further contracts when cooled, thus applying mechanical compressive and tensile stress on the fuse material attached thereto. Accordingly, when activated, the fuse material and the thermo-mechanical stressor are "super" heated in certain locals areas, causing localized melting under tensile stress, thus pulling the fuse material apart at the localized melted zones and forming gaps therein.

Figure 1:
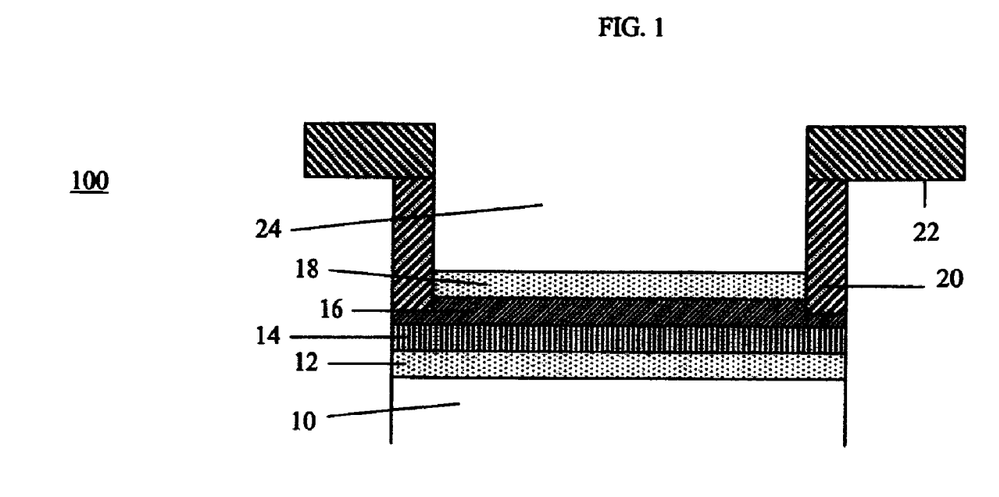
FIG. 1 is an illustration of an embodiment of a thermo-mechanical cleavable fuse in accordance with the invention.

Referring to FIG. 1, an embodiment of the invention is shown as a programmable resistor 100. The programmable resistor 100 includes a conductor 16 bonded to a thermo-mechanical stressor 18. The thermo-mechanical stressor 18 may be formed from, for example, silicon nitride which exist in an amorphous form having various ratios of silicon and nitride and thus represented as "$Si_xN_y$," or simply referred to as "SiN." The SiN may be deposited by chemical vapor deposition (CVD), which will leave hydrogen dispersed in the layer of silicon nitride. The conductor 16 may be formed of, for example, tantalum nitride ("TaN"). Additionally, the conductor 16 may be bonded to an electrical insulator 14, and the electrical insulator 14 may be bonded to the top of a second thermo-mechanical stressor 12. The second thermo-mechanical stressor 12 is arranged on top of an insulator 10. A dielectric 24, such as $SiO_2$ may be formed over the thermo-mechanical stressor 18. Thus, the layering of the programmable resistor 100 may be written as $SiO_2$—SiN—$SiO_2$—TaN—SiN—$SiO_2$.

For example, the thermo-mechanical stressor 18 may include a 700 Å thick layer of silicon nitride, and the conductor 16 may include a 500 Å layer of tantalum nitride. The electrical insulator may include 500 Å layer of an oxide such as $SiO_2$, and the second thermo-mechanical stressor 12 may include a 700 Å layer of silicon nitride.

Electrical communication with the conductor 16 is achieved through metal contacts or vias 20 attached at each end of the electrical conductor 16 and metal wires 22 attached to the metal contacts 20. It should be noted that the thermo-mechanical cleavable structure could include only the conductor 16 and the thermo-mechanical stressor(s) 18 adjacent thereto. As used herein, the terms "program," "delete," "open," "break" and similar terms all mean to form a void in an electrical conductor and increase the resistance across the electrical conductor.

Figure 2:
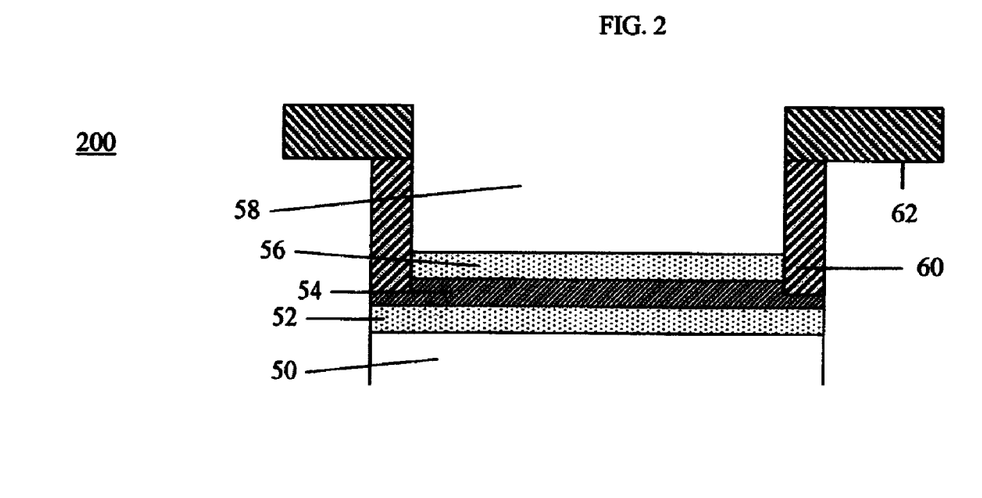
FIG. 2 is an illustration of another embodiment of a thermo-mechanical cleavable fuse in accordance with the invention.

Referring to FIG. 2, another embodiment of a programmable resistor 200 in accordance with the invention is shown. The programmable resistor 200 includes an insulator 50 which may be made from any dielectric, such as, for example, $SiO_2$. On top of the insulator 50 is a thermal-mechanical stressor 52. The thermal-mechanical stressor 52 may be formed from, for example, silicon nitride in an amorphous form. On top of the thermal-mechanical stressor 52 is a conductor 54. The conductor 54 may be made from, for example, tantalum nitride. On top of the conductor 54 is another thermal-mechanical stressor 56. On top of the thermal-mechanical stressor 56 is another insulator 58 which may be made, for example, from $SiO_2$. The structure from bottom to top of this embodiment may include $SiO_2$—SiN—TaN—SiN—$SiO_2$. Metal contacts 60 make electrical contact with the conductor 54 at either end of the conductor 54. Metal wires 62 make electrical contact with the metal contacts 60.

It should be noted that the a difference between the programmable resistor 100 of FIG. 1 and the programmable resistor 200 of FIG. 2 is that programmable resistor 200 does not have an insulator 14 between what would be the thermal-mechanical stressor 52 and the conductor 54 of programmable resistor 200. Accordingly, the programmable resistor 200 has fewer layers. The structure of the programmable resistor 200 allows the thermal-mechanical stressor 52 and the conductor 54, which together form a bilayer, to efficiently decouple from adjacent layers on both the top and the bottom of the bilayer, creating a more effective thermal isolation of the bilayer which would blow the fuse more quickly.

Another embodiment of a programmable resistor may include a layer configuration including an insulator with a thermal-mechanical stressor on top and a conductor thereon where the thermal-mechanical stressor and the conductor to form a bilayer. The bilayer would then have an insulator thereon. For example, the structure from bottom to top of this embodiment may include a layer structure such as $SiO_2$—SiN—TaN—$SiO_2$. In this embodiment, separation of the bilayer during heating from the surrounding oxide eliminates heat conduction wherever the separation occurs as part of void creation.

It should be noted that it is preferable that any type of programmable fuse may be configured to be deleted at the lowest voltage and current, and thus the lowest temperature possible. Low temperature deletion reduces damage to the region surrounding the deleted fuse. This is especially important as circuits are scaled to yet smaller sizes and devices are packed closer on a chip. It is additionally desirable for a programmable fuse's deletion voltage and current to scale with the voltage and current of the circuit incorporating the fuse. Where a fuse does not scale with circuit voltage, a separate power supply will be needed to program the fuse at the fuse's higher power requirements if the power supply for the circuit can not deliver sufficient power for deletion.

The thermo-mechanical cleavable structure, when incorporated into a fuse, allows deletion at a lower voltage and current, and thus at lower temperatures than a typical fuse. Additionally, the programming voltage and current of a programmable fuse made from a thermo-mechanical cleavable structure tends to scale with device size. Thus, a fuse made from a thermo-mechanical cleavable structure will be deletable at a voltage and current compatible with the power supply of the scaled-down device, and thus eliminates the need for an extra higher-voltage power supply.

Figure 3:
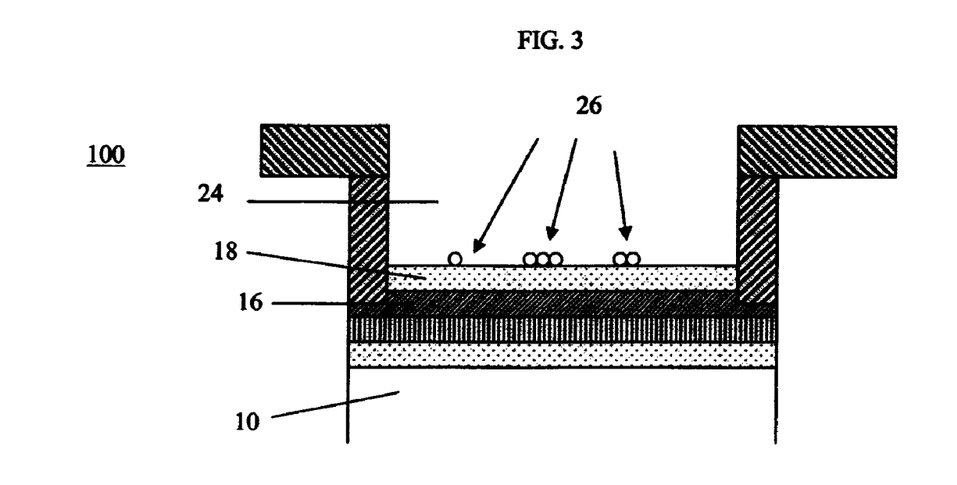
FIGS. 3-7 are steps showing the process of thermo-mechanical deletion of a thermo-mechanical cleavable fuse in accordance with the invention.

FIGS. 3-7 show the operation of the thermo-mechanical cleavable structure, and also show a method of deleting a programmable fuse using a thermo-mechanical cleavable structure. Referring now to FIG. 3, in operation of the thermo-mechanical cleavable structure 100 of FIG. 1, an electric current is run through the conductor 16, thereby heating the electrical conductor 16 and the thermo-mechanical stressor 18. The thermo-mechanical stressor 18 is constructed so that when it is heated, gas atoms or molecules contained therein are driven out of the thermo-mechanical stressor 18.

During heating, the material of the thermo-mechanical stressor will also develop compressive stress. Unconstrained, this layer would simply expand with temperature, but because it is bonded to the materials above and below it, the expansion is suppressed and causes compressive stress to develop instead. This compressive stress aids the gas evolution from the material and also aids the crystallization from the amorphous state, since both of these events lead to greater density and a relief of the compressive stress.

As gases are driven out of the thermo-mechanical stressor 18, the atoms of the thermo-mechanical stressor 18 reposition themselves to enable themselves to reduce the empty space or voids between the atoms of the thermo-mechanical stressor 18 thereby causing the material of the thermo-mechanical stressor to increase in density. Due to the increase in density of the thermo-mechanical stressor 18, it will occupy less space, and will also become even shorter once it has cooled to ambient temperatures. Accordingly, evolution of gas from the material of the thermo-mechanical stressor 18 and the accompanying crystallization of the thermo-mechanical stressor will lead to the eventual contraction of the thermo-mechanical stressor 18 over its original length at ambient temperatures.

Figure 4:
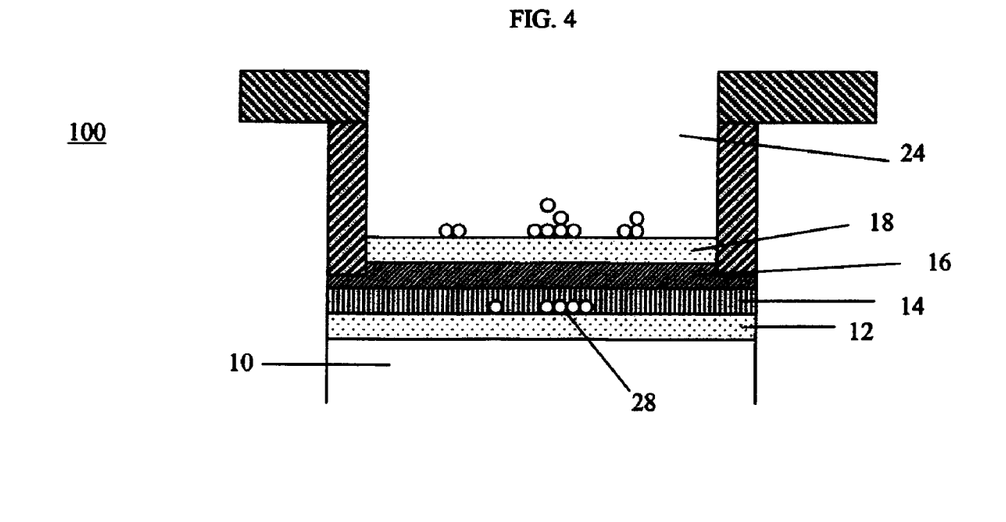

Referring to FIG. 4, continued application of current through the electrical conductor 16 causes more gas to evolve from the thermo-mechanical stressor 18. Additionally, the insulator 14 and the second thermo-mechanical stressor 12 are heated as well.

Due to the heating of the second thermo-mechanical stressor 12, gas is driven from the second thermo-mechanical stressor 12 in a manner similar to the gas driven from the thermo-mechanical stressor 18.

The gas driven from the second thermo-mechanical stressor 12 forms bubbles 28 at the interface between the second thermo-mechanical stressor 12 and the insulator 14. The bubbles 28 further thermally decouple the electrical conductor 16 from surrounding layers causing it to further heat.

Figure 5:
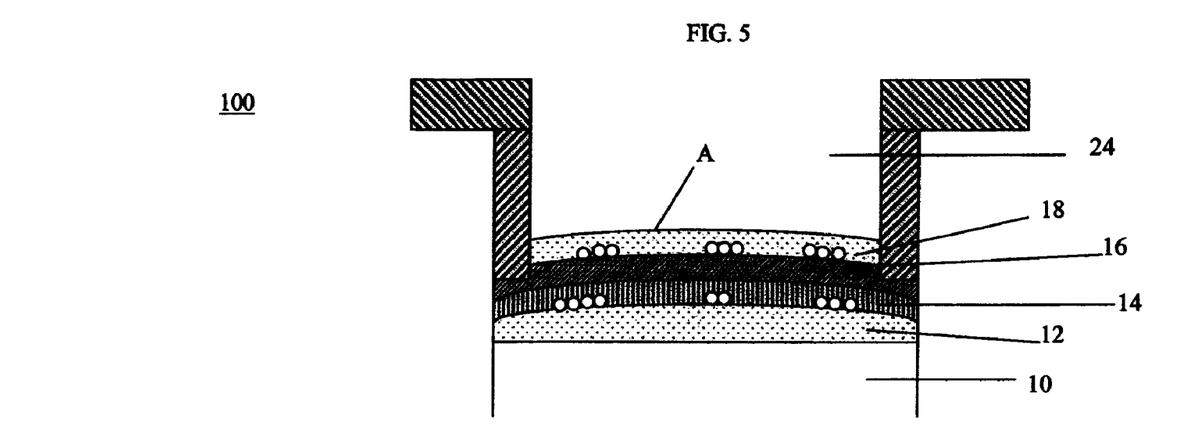

Referring to FIG. 5, the thermo-mechanical cleavable structure has been further heated, causing the electrical conductor 16 and the thermo-mechanical stressor 18 to further expand thereby bowing, and the electrical conductor 16 becomes more thermally insulated and further mechanically stressed.

Figure 6:
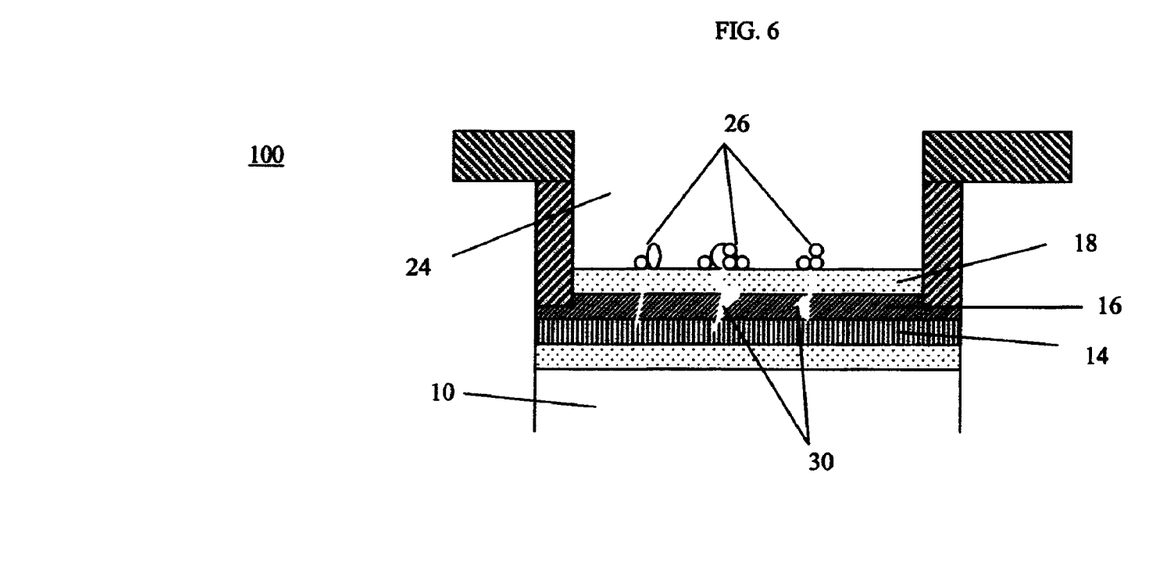

Referring to FIG. 6, localized melting 30 occurs in the electrical conductor 16 and thermo-mechanical stressor 18 of the thermo-mechanical cleavable structure 100. It should be noted that the localized melting 30 cuts through the electrical conductor 16 and the thermo-mechanical structure 18, proximate to the gas bubbles 26 because the insulating effect of the gas bubbles causes localized "super" heating. The localized melting 30 may extend into insulator 14. The localized melting 30 breaks the electrical continuity of the electrical conductor 16 and thus abruptly stops the heating process. At this point, some layers may detach from adjacent layers, such as, for example, the thermal-mechanical stressor 18 may detach from the overlaying dielectric 24 to form a void A.

Figure 7:
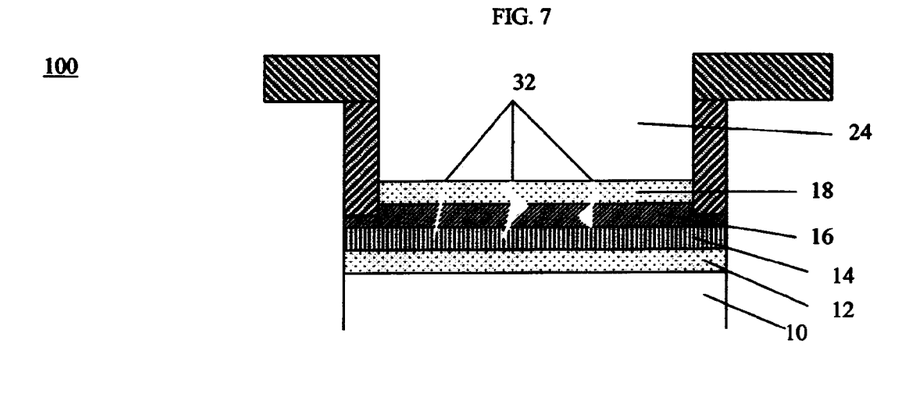

Referring to FIG. 7, once the heating process stops, the electrical conductor 16 and the thermo-mechanical stressor 18 rapidly cools and thus thermally contracts, thereby creating tensile stress in the thermo-mechanical stressor 18 and the electrical conductor 16. Additionally, because the thermo-mechanical stressor 18 has had gas driven therefrom and its density increased, it will now have a shorter overall length at ambient temperature then before the heating process. Thus, the densification of the thermo-mechanical stressor 18 causes additional tensile stress on the electrical conductors 16 causing it to contract yet further.

As a result of the tensile stress, the electrical conductor 16 and the thermo-mechanical stressor 18, gaps or voids 32 are formed in the electrical conductor 16. It should be noted that the voids 32 are actual physical gaps in the electrical conductor 16 formed by the tensile stress in the electrical conductor 16 and the thermo-mechanical stressor 18. Accordingly, because the voids 32 are not formed by a "burning" process, there are little or no debris created by the formation of the gaps 32. It should further be noted that the gaps 32 are contained fractures and thus are limited substantially to the thermo-mechanical stressor 18 and the electrical conductor 16 and the immediate surrounding layers. The gaps 32 typically do not extend beyond the immediate area of the electrical conductor 16 layer.

For example, a thermo-mechanically cleavable resistor may be formed where the electrical conductor 16 is tantalum nitride and the thermo-mechanical stressor 18 and second thermo-mechanical stressor 12 are amorphous silicon nitride ($Si_xN_y$). The tantalum nitride and the silicon nitride may be referred to as a bi-layer. The tantalum nitride may also be referred to as a metal fuse link. As the tantalum nitride material absorbs electrical energy, the temperature of the tantalum nitride or metal fuse link increases. Two phenomenon are activated by this increase in temperature. First, the amorphous $Si_xN_y$ is heated to a temperature sufficient to emit gaseous $H_2$ ($Si_xN_y$ has about 20% $H_2$ in the film due to CVD precursors), and revert to a more dense polycrystalline and compositionally pure $Si_3N_4$ layer. Second, the tantalum nitride layer and the $Si_xN_y$ layer experience compressive stress due to the heating.

In other words, the combination of heating and compressive stress together make it energetically feasible for the $Si_xN_y$ to revert to the crystalline $Si_3N_4$ phase, which is denser and reduces the compressive stress. Formation of $H_2$ bubbles or gases at the interface between the overlaying dielectric 24 and the $Si_xN_y$ serves to thermally and mechanically decouple the upper surface of the $Si_xN_y$ layer from the dielectric 24, which in turns allows the tantalum and silicon nitride bi-layer to heat even more rapidly and expand. The expansion, in turn generates a compressive film stress that bows the bi-layer upward where the bi-layer is the hottest, and where the decoupling due to evolve $H_2$ is the greatest.

When the bi-layer is sufficiently hot, $H_2$ is also emitted from the underlying $Si_xN_y$ layer, thermally decoupling the bottom of the second thermo-mechanical stressor from the top of the substrate, and runaway heating causes the bi-layer to melt locally and become discontinuous, severing the electrical circuit. In the absence of flowing current, the entire structure cools rapidly (on the order of microseconds), and the combined tensile stress caused by the difference of thermal contraction between the bi-layer and surrounding layers becomes large enough to fracture the tantalum nitride. Accordingly, cracks extend up and down through the tantalum nitride layer, perpendicular to the long axis of the bi-layer. Due to the non-stoichiometric nature of SiN, multiple stress-assisted cracks can be formed with this method.

In other words, a "smart self-cleave" process includes a micro-mechanical stress-induced cut formed during fuse programming to achieve a lower deletion energy. Multiple crack sites in the conductor are formed after fuse programming with guaranteed multiple, physical separations of fused material. Minimal damage and crack propagation to the surrounding area reduces unwanted damage to the surrounding area after fusing. Tight distribution of the initial resistance of the electric fuse before programming, and a low value of the resistance allow for very high-speed programmable array logic devices. Fast pulse fusing may be performed at both the wafer level and module level.

A reliable programmable fuse with a reduced potential for re-grown conductive materials and void healing is provided by thermo-mechanical cleavable structure. The thermo-mechanical cleavable structure is scalable, works at any metal level, and works better at high metal levels requiring lower energy to delete. Composition of the layer structure includes various refractory metals such as SiN-refractory metals-$SiO_2$—SiN for BEOL E-fuse application, where the term "refractory metals" includes, but is not limited to tungsten (W), tantalum (Ta), molybdenum (Mo), rhenium (Re), Titanium (Ti), and niobium (Nb). The use of this type of stacked layer will reduce metal deletion energy. Additionally, a novel N-T-O-N (SiN—TaN—$SiO_2$—SiN) composite structure also provides a thermo-mechanical fuse. Furthermore, a self-laminating bi-layer may also include refractory metal-SiN and NTON and could also include NT, TN, NTN, depending on processing needs, etc. In use, the TaN material will be capable of absorbing the electrical energy such that the temperature of the metal fuse line will increase.

Table 2 shows deletion current for an NTON thermo-mechanical cleavable fuse compared to typical deletion current:

TABLE 2

| Width (um) | Length (um) | New vs. old fusing current (mA) | New equivalent melting temp (C.) |
|---|---|---|---|
| 10 | 10 | 45.95/126.28 | 2006 |
| 20 | 10 | 25/208.3 | 1031 |

TABLE 2-continued

| Width (um) | Length (um) | New vs. old fusing current (mA) | New equivalent melting temp (C.) |
|---|---|---|---|
| 20 | 20 | 48.24/208.3 | 1266 |
| 15 | 30 | 27.51/167.89 | 782 |
| 15 | 45 | 25.54/167.89 | 697 |
| 10 | 50 | 19.51/126.28 | 714 |

Columns 1 and 2 of Table 2 list the dimension in microns of the corresponding fuses. Column 3 compares new vs. old programmable currents for a thermo-mechanical cleavable fuse vs. a typical fuse. Column 4 shows the equivalent melting temperature of the thermo-mechanical cleavable fuse as compared to a typical TaN programmable fuse at 3100° C. Table 2 shows how programmable fuses with a thermo-mechanical cleavable structure may be deleted at lower currents and thus a lower and less damaging temperature.

Accordingly, where the thermo-mechanical cleavable structure 100 is employed as a programmable fuse, the structure provides a reliable and robust programmable fuse that may be positioned in close proximity to nearby elements on a wafer. For example, referring to FIG. 8, a graph showing current and resistance versus voltage during programming of a programmable fuse constructed with a thermo-mechanical cleavable structure is shown. The structure of the electrical conductor includes a ten-micron by ten-micron TaN fuse element. In the graph, the x-axis is in voltage (V), the left y-axis is current in amps (A), and the right y-axis is resistance in Ohms ($\Omega$). The line connecting the square data points represents current through the programmable fuse and the line through the circular data points represents the resistance of the programmable fuse during a programming cycle.

Figure 8:
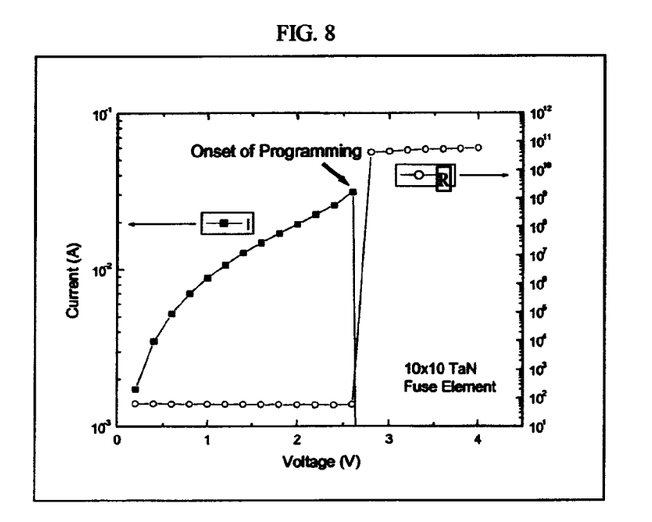
FIG. 8 shows current and resistance during programming a fuse in accordance with the invention.

In this example, the programmable fuse is deleted when the voltage through the electrical conductor of the programmable fuse reaches a value of approximately 2.7 V. Thus, as voltage through the programmable fuse is increased from 0 V up to about 2.7 V, current increases up to a final value of about 0.03 A while resistance remains at about 60$\Omega$. Once the voltage applied to the programmable fuse reaches about 2.7 V, programming of the fuse quickly occurs, and gaps or voids are formed in the electrical conductor of the fuse. The formation of gaps in the electrical conductor causes the current to drop to essentially zero, and the resistance to rise to about 100 M$\Omega$.

Figure 9:
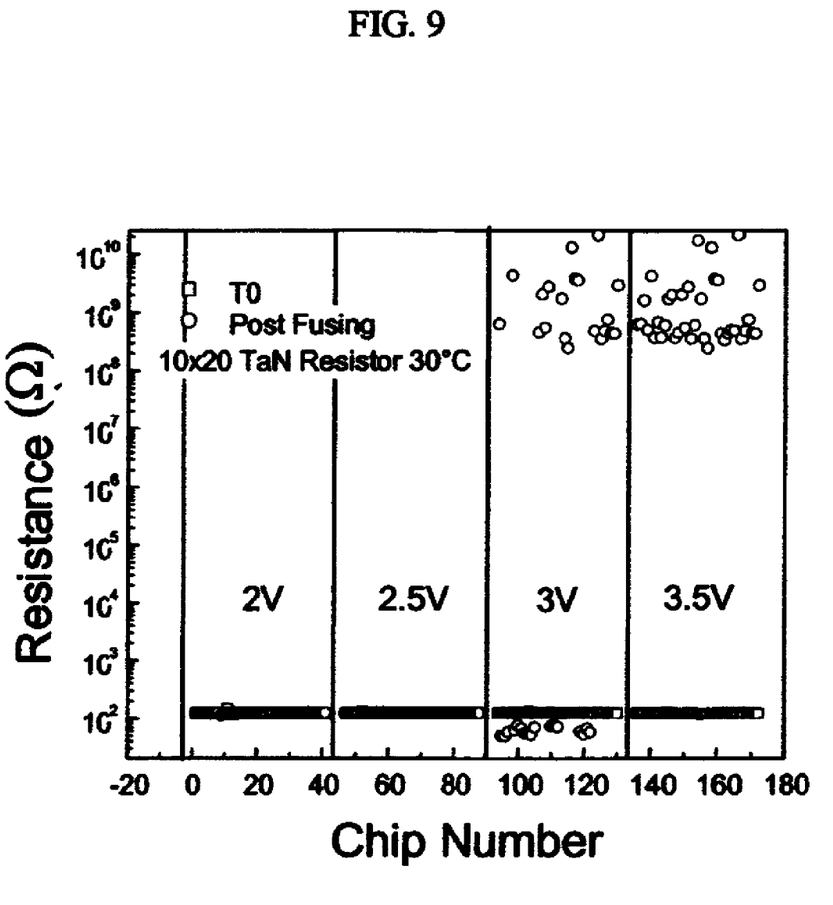
FIG. 9 shows resistivity versus chip number for various thermo-mechanical cleavable fuses programmed at various voltages in accordance with the invention.

Referring to FIG. 9 the deletion success rate is shown for various fuses incorporating a thermo-mechanical cleavable structure in accordance with the invention. In the graph of FIG. 9, the x-axis represents chip number and the y-axis represents resistance in $\Omega$. The x-axis is additionally divided into voltage groups of 2 V, 2.5 V, 3 V and 3.5 V, representing the programming voltage applied to the particular chip number represented by the x-axis. The data is for fuses having a 10-micron wide by 20-micron long tantalum nitride resistor at an ambient temperature of 30° C.

FIG. 9 shows that for programming voltages of 2 V and 2.5 V, no fuses are programmed or deleted. At a programming voltage of 3 V, a portion of the fuses are successfully programmed, however, a substantial percentage of fuses are not successfully programmed. At 3.5 V, all fuses are successfully programmed. Thus, FIG. 8 shows that at a relatively low programming voltage of 3.5 V, a fuse made of tantalum nitride 10 microns wide and 20 microns long has a 100% successful deletion rate.

Figure 10:
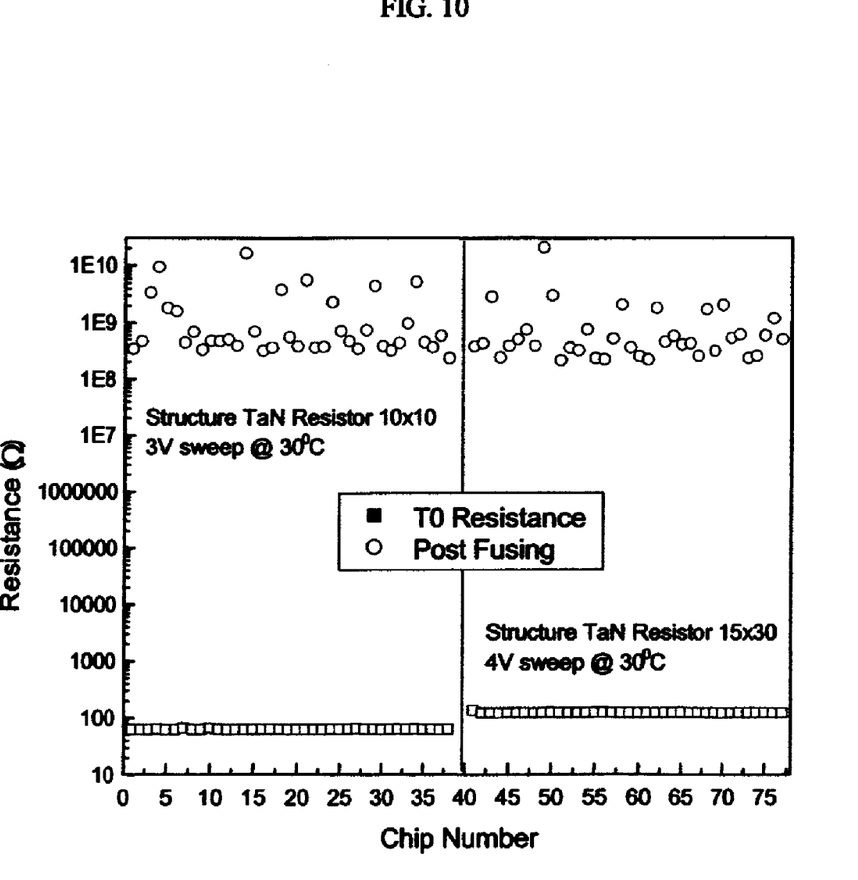
FIG. 10 shows before and after programming resistance of a thermo-mechanical cleavable fuse in accordance with the invention.

Referring to FIG. 10, the deletion success for multiple 10-micron by 10-micron tantalum nitride resistors and for multiple 15 micron by 30-micron tantalum nitride fuses are shown in accordance with the invention. As in FIG. 9, the x-axis is chip number and the y-axis is resistance of the programmable fuse in Ohms. Additionally, the left half of the graph represents a 3 V programming voltage for the 10-micron by 10-micron tantalum nitride programmable fuse and the right half of the graph represents a 4 V programming voltage for the 15-micron by 30-micron tantalum nitride fuse.

The graph shows that the resistance of all of the programmable fuses is approximately 100Ω before deletion. After the deletion process, the resistance of all of the fuses is greater than 100 kΩ. Thus, FIG. 10 shows that all of the programmable fuses of two different structures were successfully deleted at voltages below 5 V. Accordingly, FIG. 10 indicates the high programming reliability at low voltages for the thermo-mechanical cleavable structure used as a programmable fuse.

Figure 11:
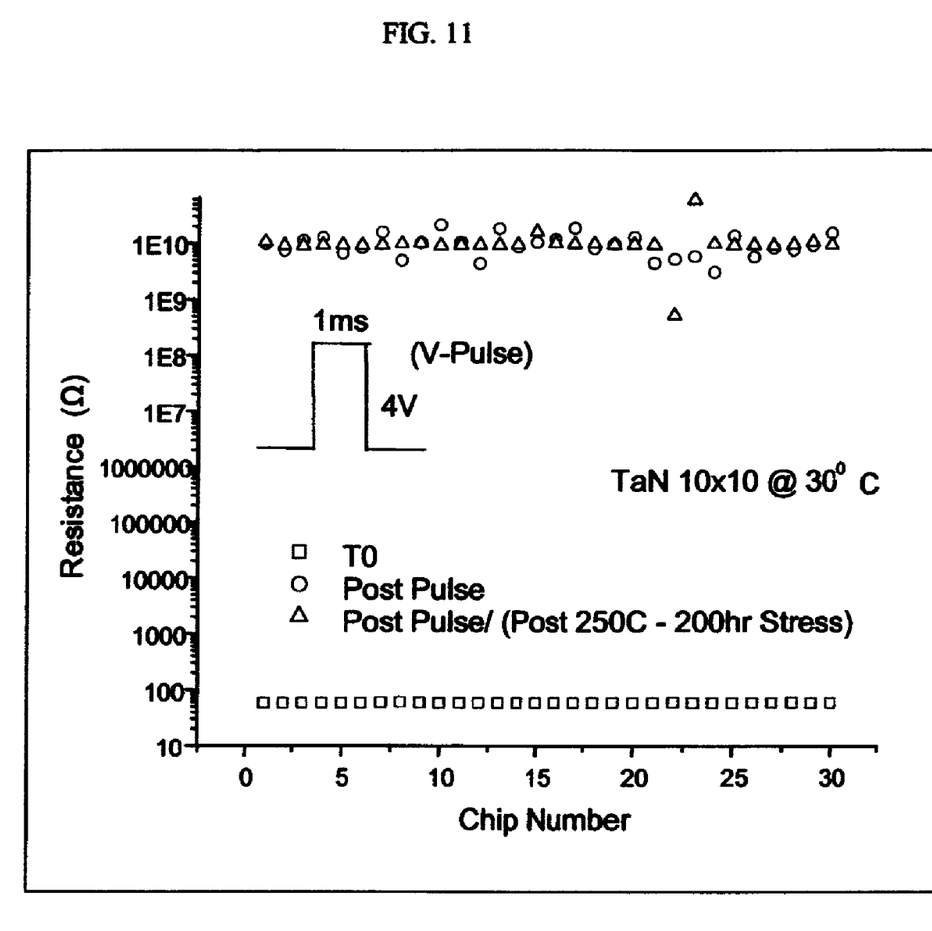
FIG. 11 shows thermal stability of a thermo-mechanical cleavable fuse in accordance with the invention.

Referring to FIG. 11, a graph showing thermal stability of programmed fuses having a thermo-mechanical cleavable structure is shown for about thirty (30) 10 micron by 10 micron nitride programmable fuses in accordance with the invention. The x-axis represents chip number, and the y-axis represents resistance in Ohms. The square data points are resistance of the various programmable fuses before deletion, and the rounded data points are the resistance of the various programmable fuses after deletion. Additionally, the triangular data points are the resistance of the various programmable fuses after deletion and after a 200-hour high temperature storage period at 250° C.

As can be seen from FIG. 11, the post-deletion resistance of the multiple programmable fuses for 30° C. ambient temperature for a programming signal having a 4 V square pulse 1 mS long is about 10 MΩ. Additionally, after thermally stressing the programmed fuses, the majority of deleted fuses retain the 10 MΩ resistance and all of the deleted fuses retain at least a 100 kΩ resistance. Thus, FIG. 11 shows that the programmable fuses retain a high degree of thermal stability after deletion, indicating that the programmable fuses will reliably remain in the deleted state after programming.

Figure 12:
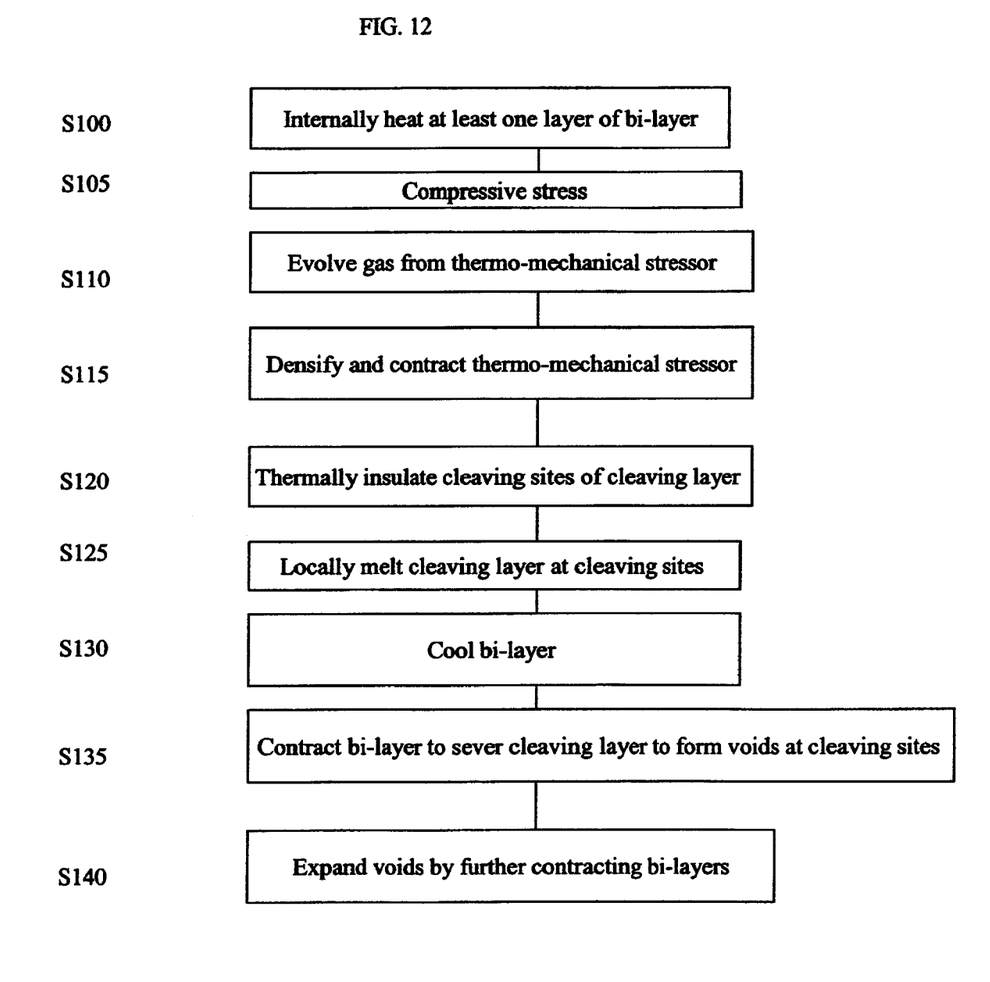
FIG. 12 shows a flow chart for programming a resistor in accordance with the invention.

Referring to FIG. 12, a flow diagram is shown for creating a thermo-mechanical cleavable structure. In step S100, the thermo-mechanical cleavable structure, which consists of a bi-layer having a thermo-mechanical stressor layer and a cleavable layer adjacent to one another is internally heated. For example, where the cleavable layer is an electrical conductor, current is passed through the cleavable layer causing both the cleavable layer and the thermo-mechanical stressor to heat. In step S105, the heating of the thermo-mechanical stressor and the conductive cleaveable layer cause both to enter a state of compressive mechanical stress. In step S110, the compressive stress, along with the heat, drives the evolution of gas from the interior of the thermo-mechanical stressor.

In step S115, compression and gas evolution allow a reorientation and repacking (or densification) of the microstructure of the thermo-mechanical stressor thereby increasing the density of the material forming the thermo-mechanical stressor from an amorphous to a crystalline state. This increase in density, or densification, causes the thermo-mechanical stressor to contract in length and width and to relieve the mechanical compressive stress. Additionally, the evolution of gas causes bubbles to form on the upper surface of the thermo-mechanical stressor. In other words, the bi-layer goes into a state of compressive stress as it heats up, and the compressive stress helps drive gas evolution therefrom and microstructure densification therein.

In step S120, bubbles on the top of the thermo-mechanical stressor act as localized thermal insulation by impeding the conduction of heat from the thermo-mechanical stressor to the surrounding material. Due to the localized thermal insulation of the bubbles, the region of the thermo-mechanical stressor and the cleavable layer proximate to the gas bubbles is heated to a higher temperature than the surrounding portions of the thermo-mechanical stressor and cleavable layer. Additionally, the bi-layer expands due to thermal expansion as it is heated.

In step S125, portions of the bi-layer adjacent to the evolved bubbles become sufficiently hot to melt the bi-layer in that area. These locally melted regions will become the cleaving sites of the thermo-mechanical cleavable structure. Once the bi-layer has been locally melted forming cleaving sites, the bi-layer is rapidly cooled, causing the bi-layer to thermally contract along its length in step S130 and step S135. For example, if the cleaving layer is an electrical conductor with current passing therethrough to heat the bi-layer, the local melting at the cleaving sights will interrupt the flow of current and terminate the heating process, causing the bi-layer to cool.

In step S135, as the bi-layer cools, it contracts, causing the cleaving sites to pull apart and form voids. In step S140, the voids at the cleaving sites are further expanded due to the prior densification and thermal contraction of the cleaving layer. Accordingly, voids are formed in the cleavable layer, without burning material away, and thus the formation of burn debris is avoided. Additionally, due to the contraction caused by densification, the gaps formed at the cleaving sites are relatively large, which mitigates against later bridging or closure of the gaps. Because the voids are formed based on the melting of the bi-layer, the voids have a limited tendency to extend beyond the bi-layer.

As should now be understood, in embodiments of the invention:

1. The amorphous $Si_xN_y$ begins to emit gaseous $H_2$ (SiN contains $H_2$ in the film due to CVD (chemical vapor deposition)) precursors and revert to a more dense polycrystalline (and compositionally pure) $Si_3N_4$ layer; and 2. The TaN layer and the $Si_xN_y$ layers experience compressive stress due to the heating.

Thus, in embodiments, the combination of heating and compressive stress together make it energetically feasible for the $Si_xN_y$ to revert to the $Si_3N_4$, which is denser and reduces the compressive stress at the elevated temperature.

The formation of the $H_2$, or other gas, bubbles in the $SiO_2$ layers in contact with the $Si_xN_y$ serves to thermally and mechanically decouple the upper surface of the $Si_xN_y$ layer from the overlying oxide, which, in turn, allows the TaN—SiN layer, for example, to heat up even more rapidly and expand. The expansion, in turn, generates the compressive film stress that bows the SiN—TaN bilayer upwards where the bilayer is the hottest, and where decoupling due to the evolved $H_2$ is the greatest. When the bilayer is sufficiently hot, the $H_2$, or other gas, is also emitted from the underlying SiN layer, thermally decoupling the bottom of the bilayer from the substrate, and runaway heating causes the bilayer to melt locally and become discontinuous, severing the electrical circuit.

In the absence of flowing current, the entire structure cools rapidly and the combined tensile stresses caused by the difference in thermal contraction between the bilayer and the surrounding $SiO_2$ becomes large enough to fracture the $SiO_2$. This creates the cracks, as shown for example, in FIG. 7.

Also, the formation of the $H_2$, or other gas, bubbles between the SiN and adjacent layer also may assist in the utility of this fuse configuration in that the thermal decoupling permits the TaN layer to be heated to a much higher temperature for the same amount of current. This reduces the amount of power required to blow the fuse and also serves to reduce the local damage adjacent to the fuses. Also, in the configuration of the invention, programming causes minimal damage/crack propagation in the surrounding area, providing protection to nearest neighbor fuses and surrounding metal lines due to the significantly lower fuse deletion energy achieved by the stress induced thermal mechanical decoupling.

While the invention has been described in terms of exemplary embodiments, those skilled in the art will recognize that the invention can be practiced with modifications and in the spirit and scope of the appended claims.

What is claimed is:

1. A thermo-mechanical cleavable structure, comprising:
   a first thermo-mechanical stressor;
   a thermal element formed below the first thermo-mechanical stressor configured to generate heat thereby causing a delamination of the first thermo-mechanical stressor from an adjacent layer;
   a first electrical insulator layer formed below the thermal element opposite the first thermo-mechanical stressor;
   a second thermo-mechanical stressor formed below the first electrical insulator layer opposite the first thermo-mechanical stressor and the thermal element,
   wherein the first thermo-mechanical stressor is bounded between a first metal contact and a second metal contact; and
   a second electrical insulator layer formed below the second thermo-mechanical stressor opposite the first thermo-mechanical stressor, the thermal element, and the first electrical insulator,
   wherein the first thermo-mechanical stressor is sandwiched between the first metal contact and the second metal contact, and
   wherein the first metal contact is attached at a first end portion of the thermal element and the second metal contact is attached at a second end portion of the thermal element.

2. The thermo-mechanical cleavable structure of claim 1, wherein the first thermo-mechanical stressor comprises silicon nitride and the thermal element comprises tantalum nitride.

3. The thermo-mechanical cleavable structure of claim 2, wherein the first thermo-mechanical stressor comprises a 700 Å thick layer of silicon nitride and the thermal element comprises a 500 Å layer of tantalum nitride.

4. The thermo-mechanical cleavable structure of claim 1, wherein the thermal element is configured to generate heat from electricity, wherein the first thermo-mechanical stressor is configured to produce a gas when heated and increase in density when it produces a gas.

5. The thermo-mechanical cleavable structure of claim 4, wherein the first thermo-mechanical stressor is configured to contract when cooled.

6. The thermo-mechanical cleavable structure of claim 1, wherein the thermal element comprises a refractory metal including at least any one of tungsten, tantalum, molybdenum, rhenium, and niobium.

7. The thermo-mechanical cleavable structure of claim 1, wherein the thermo-mechanical cleavable structure is an electrically-controlled thermo-mechanical cleavable structure.

8. The thermo-mechanical cleavable structure of claim 1, wherein the thermal element is configured to generate heat thereby additionally causing a formation of contained fractures in the thermal element and the first thermo-mechanical stressor.

9. The thermo-mechanical cleavable structure of claim 1, wherein the first electrical insulator layer is sandwiched between the second thermo-mechanical stressor and the thermal element.

10. The thermo-mechanical cleaveable structure of claim 1, wherein a portion of the thermal element is bounded between the first metal contact and the second metal contact.

11. A thermo-mechanical cleavable structure, comprising:
    a first thermo-mechanical stressor;
    a thermal element formed below the first thermo-mechanical stressor configured to generate heat thereby causing a delamination of the first thermo-mechanical stressor from an adjacent layer;
    a first electrical insulator layer formed below the thermal element opposite the first thermo-mechanical stressor;
    a second thermo-mechanical stressor formed below the first electrical insulator layer opposite the first thermo-mechanical stressor and the thermal element,
    wherein the first thermo-mechanical stressor is bounded between a first metal contact and a second metal contact; and
    a second electrical insulator layer formed below the second thermo-mechanical stressor opposite the first thermo-mechanical stressor, the thermal element, and the first electrical insulator,
    wherein the first thermo-mechanical stressor is sandwiched between the first metal contact and the second metal contact, and
    wherein a length of the first thermo-mechanical stressor is such that the first thermo-mechanical stressor is contained completely within a space defined by the first metal contact and the second metal contact.

12. A thermo-mechanical cleavable structure, comprising:
    a first thermo-mechanical stressor;
    a thermal element formed below the first thermo-mechanical stressor configured to generate heat thereby causing a delamination of the first thermo-mechanical stressor from an adjacent layer;
    a first electrical insulator layer formed below the thermal element opposite the first thermo-mechanical stressor;
    a second thermo-mechanical stressor formed below the first electrical insulator layer opposite the first thermo-mechanical stressor and the thermal element,
    wherein the first thermo-mechanical stressor is bounded between a first metal contact and a second metal contact; and
    a second electrical insulator layer formed below the second thermo-mechanical stressor opposite the first thermo-mechanical stressor, the thermal element, and the first electrical insulator,
    wherein the first thermo-mechanical stressor is constrained between the first metal contact and the second metal contact when voltage is applied to the first metal contact and the second metal contact.

13. A thermo-mechanical cleavable structure, comprising:
    a first thermo-mechanical stressor;
    a thermal element formed below the first thermo-mechanical stressor configured to generate heat thereby causing a delamination of the first thermo-mechanical stressor from an adjacent layer;
    a first electrical insulator layer formed below the thermal element opposite the first thermo-mechanical stressor;
    a second thermo-mechanical stressor formed below the first electrical insulator layer opposite the first thermo-mechanical stressor and the thermal element,
    wherein the first thermo-mechanical stressor is bounded between a first metal contact and a second metal contact;

a second electrical insulator layer formed below the second thermo-mechanical stressor opposite the first thermo-mechanical stressor, the thermal element, and the first electrical insulator; and a dielectric layer formed over the first thermo-mechanical stressor opposite the thermal element, the first electrical insulation layer, the second thermo-mechanical stressor, and the second electrical insulation layer.

14. The thermo-mechanical cleavable structure of claim 13, wherein:

the first thermo-mechanical stressor is directly in contact with and formed completely below the dielectric layer;

the thermal element comprises a tantalum nitride layer directly in contact with and formed completely below the first thermo-mechanical stressor opposite the dielectric layer;

the first electrical insulator layer is directly in contact with and formed completely below the tantalum nitride layer opposite the dielectric layer and the first thermo-mechanical stressor;

the second thermo-mechanical stressor is directly in contact with and formed completely below the first electrical insulator layer opposite the dielectric layer, first thermo-mechanical stressor, and the tantalum nitride layer;

the second electrical insulator layer is directly in contact with and formed completely below the second thermo-mechanical stressor opposite the dielectric layer, the first thermo-mechanical stressor, the tantalum nitride layer, and the first electrical insulator;

the first metal contact is directly in contact with and attached completely above a first end portion of the tantalum nitride layer;

the second metal contact is directly in contact with and attached completely above a second end portion of the tantalum nitride layer; and the first thermo-mechanical stressor and a portion of the tantalum nitride layer are directly in contact with and bounded between the first metal contact and the second metal contact.

15. The thermo-mechanical cleavable structure of claim 14, further comprising metal wires directly in contact with and attached completely above the first metal contact and the second metal contact.

16. A thermo-mechanical cleavable structure, comprising:

a dielectric layer;

a first thermo-mechanical stressor directly in contact with and formed completely below the dielectric layer;

a thermal element comprising a tantalum nitride layer directly in contact with and formed completely below the first thermo-mechanical stressor opposite the dielectric layer, the tantalum nitride layer configured to generate heat thereby causing a delamination of the first thermo-mechanical stressor from an adjacent layer;

a first electrical insulator layer directly in contact with and formed completely below the tantalum nitride layer opposite the dielectric layer and the first thermo-mechanical stressor;

a second thermo-mechanical stressor directly in contact with and formed completely below the first electrical insulator layer opposite the dielectric layer, first thermo-mechanical stressor, and the tantalum nitride layer;

a second electrical insulator layer directly in contact with and formed completely below the second thermo-mechanical stressor opposite the dielectric layer, the first thermo-mechanical stressor, the tantalum nitride layer, and the first electrical insulator;

a first metal contact directly in contact with and attached completely above a first end portion of the tantalum nitride layer;

a second metal contact directly in contact with and attached completely above a second end portion of the tantalum nitride layer, wherein the first thermo-mechanical stressor and a portion of the tantalum nitride layer is directly in contact with and bounded between the first metal contact and the second metal contact; and metal wires directly in contact with and attached completely above the first metal contact and the second metal contact.

17. The thermo-mechanical cleavable structure of claim 16, wherein the first thermo-mechanical stressor and the second thermo-mechanical stressor comprise silicon nitride.

* * * * *